(12) United States Patent
Smith et al.

(10) Patent No.: US 10,896,703 B2
(45) Date of Patent: *Jan. 19, 2021

(54) MEMORY DEVICE WITH AN INPUT SIGNAL MANAGEMENT MECHANISM

(71) Applicant: Micron Technology, Inc., Boise, ID (US)

(72) Inventors: Scott E. Smith, Plano, TX (US); Vijayakrishna J. Vankayala, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/523,952

(22) Filed: Jul. 26, 2019

(65) Prior Publication Data

US 2019/0348088 A1   Nov. 14, 2019

Related U.S. Application Data

(63) Continuation of application No. 15/975,713, filed on May 9, 2018, now Pat. No. 10,475,488.

(51) Int. Cl.
| | | |
|---|---|---|
| *G11C 7/10* | (2006.01) | |
| *G11C 7/22* | (2006.01) | |
| *G11C 11/408* | (2006.01) | |
| *G11C 11/4093* | (2006.01) | |

(52) U.S. Cl.
CPC .......... *G11C 7/1093* (2013.01); *G11C 7/1072* (2013.01); *G11C 7/22* (2013.01); *G11C 11/4082* (2013.01); *G11C 11/4093* (2013.01)

(58) Field of Classification Search
CPC . G11C 7/1093; G11C 7/1072; G11C 11/4093; G11C 7/22; G11C 11/4082
See application file for complete search history.

(56) References Cited

U.S. PATENT DOCUMENTS

| | | | |
|---|---|---|---|
| 8,127,169 B2 | 2/2012 | Kim | |
| 10,475,488 B1 * | 11/2019 | Smith | G11C 7/1072 |
| 2008/0094890 A1 * | 4/2008 | Kim | G11C 29/26 365/185.2 |
| 2010/0090675 A1 | 4/2010 | Dono et al. | |
| 2013/0077429 A1 * | 3/2013 | Kondo | G11C 7/24 365/230.06 |
| 2013/0272052 A1 * | 10/2013 | Kim | G11C 8/18 365/145 |

* cited by examiner

*Primary Examiner* — David Lam
(74) *Attorney, Agent, or Firm* — Perkins Coie LLP

(57) ABSTRACT

A memory device includes: a set of input pads configured to receive from a source external to the memory device one or more input signals and a chip select signal; an operation circuit electrically coupled to the input pads, operation circuit configured to perform operations corresponding to the one or more input signals when the chip select signal is enabled; and an input management circuit electrically coupled to and between the input pads and the operation circuit, the input management circuit configured to control propagation of the one or more input signals based on the chip select signal.

20 Claims, 5 Drawing Sheets

MEMORY DEVICE WITH AN INPUT SIGNAL MANAGEMENT MECHANISM

CROSS-REFERENCE TO RELATED APPLICATIONS

This application is a continuation of U.S. application Ser. No. 15/975,713, filed May 9, 2018, which is incorporated herein by reference in its entirety.

TECHNICAL FIELD

The disclosed embodiments relate to memory devices, and, in particular, to memory devices with a mechanism for managing input signals.

BACKGROUND

Memory systems can employ memory devices to store and access information. The memory devices can include volatile memory devices, non-volatile memory devices, or a combination device. Memory devices, such as dynamic random-access memory (DRAM), can utilize electrical energy to store and access data. For example, the memory devices can include Double Data Rate (DDR) RAM devices that implement DDR interfacing scheme (e.g., DDR4, DDR5, etc.) for high-speed data transfer.

With technological advancements in other areas and increasing applications, the market is continuously looking for faster, more efficient, and smaller devices. To meet the market demand, the semiconductor devices are being pushed to the limit. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

DETAILED DESCRIPTION

As described in greater detail below, the technology disclosed herein relates to memory devices, systems with memory devices, and related methods for managing propagation of input signals. The memory devices (e.g., DRAM devices) can include an input management mechanism/circuit configured to control propagation/delivery of input signals (e.g., command signals and/or input address signals) therein. For example, the memory devices can include input control circuit(s) that include gates (e.g., AND or NAND gates) configured to control propagation of the input signals based on a corresponding chip select (CS) signal. The input management mechanism can allow the input signals to propagate through the input control circuit(s) when the chip select signal is enabled. Accordingly, the memory devices can stop propagation of the input signals when the CS signal is not enabled, such as when the input signals are not designated to be processed by down-stream circuits. By stopping the propagation of unnecessary input signals, the memory devices can reduce power consumed by the input path.

Figure 1:
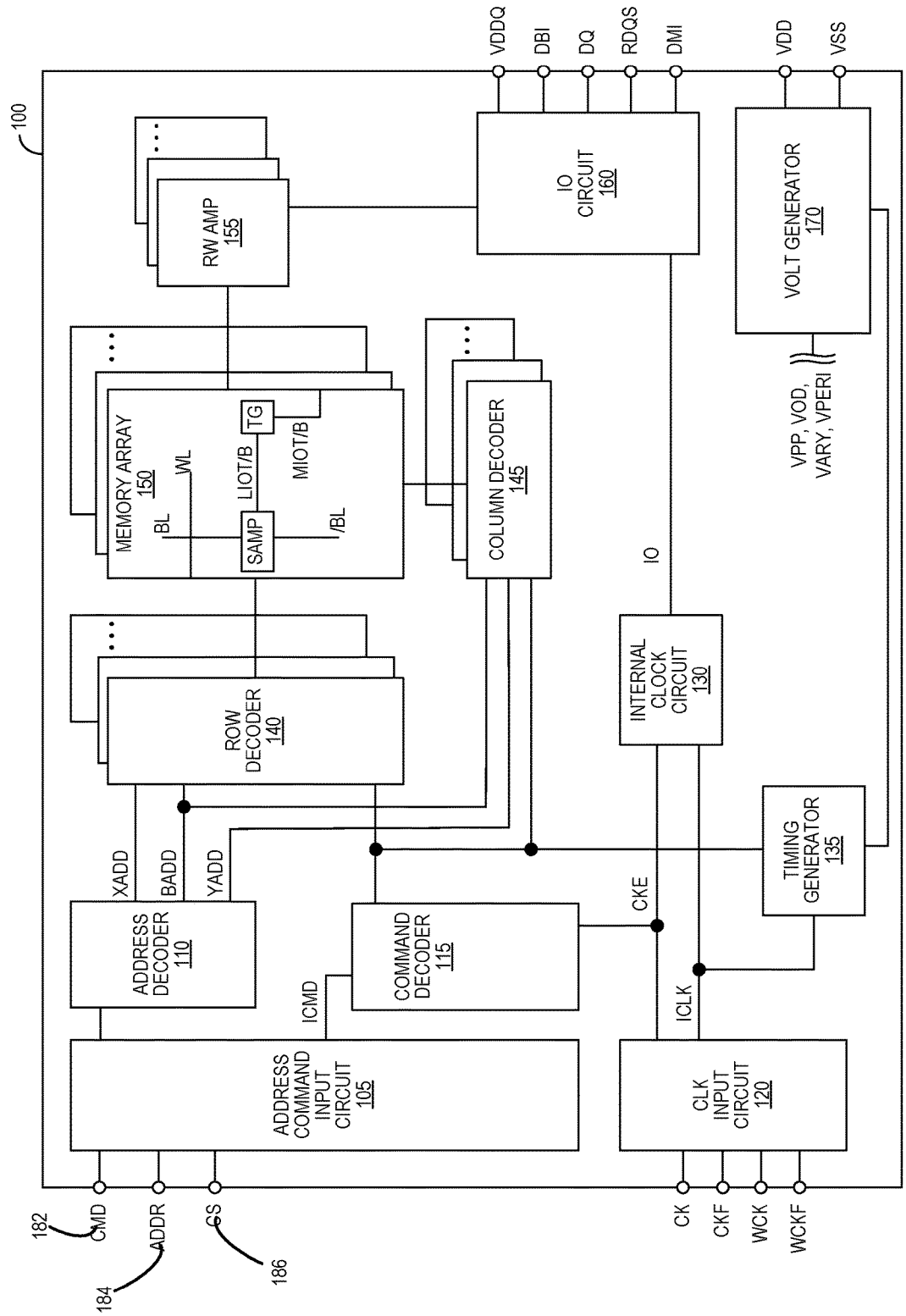
FIG. 1 is a block diagram of a memory device in accordance with an embodiment of the present technology.

FIG. 1 is a block diagram of a memory device 100 (e.g., a semiconductor memory device, such as a DRAM device) in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals 182 (CMD) and address signals 184 (ADDR), respectively. The memory device may further include a chip select terminal to receive a chip select signal 186 (CS), clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal 184 and a bank address signal from outside. The address signal 184 and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals 182 (CMD), address signals 184 (ADDR), and chip select signals 186 (CS), from a memory controller. The command signals 182 may represent various memory commands from the memory controller (e.g., including access commands, which can include read commands and write commands). The chip select signal 186 may be used to select the memory device 100 to respond to commands 182 and addresses 184 provided to the command and address terminals. When an active chip select signal 186 is provided to the memory device 100, the commands 182 and addresses 184 can be decoded and memory operations can be performed. The command signals 182 may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 may further include one or more registers 117 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

The external electronic devices (e.g., the memory controller) can provide the memory device 100 with the input signals (e.g., the command signal 182, the address signal 184, the chip select signal 186, etc.). Since the input signals are external inputs, they can toggle in the overall system (e.g., outside of the memory devices) and pass into the memory device 100 (e.g., dies) even though the device 100 may not be the actual target/destination of the input signals. If left alone, the input signals can travel through the die and the memory device 100 can consume power, such as through input buffers and/or other circuit components. To reduce the unnecessary power expenditure (e.g., by circuits/components downstream, such as command/address decoders, memory array, IO circuit 160, etc.), the memory device 100 can include circuitry (e.g., input management mechanism/circuit) to regulate the propagation of the input signals through the die. For example, the input management mechanism can include one or more input control circuits/gates configured to allow propagation of the input signals (e.g., the command signal 182, the address signal 184, etc.) when the chip select signal 186 is enabled for the memory device 100. In some embodiments, the input management mechanism can be included in the command/address input circuit 105. In some embodiments, the input management mechanism can be located between the input port/pad and the command/address input circuit 105.

Figure 2:
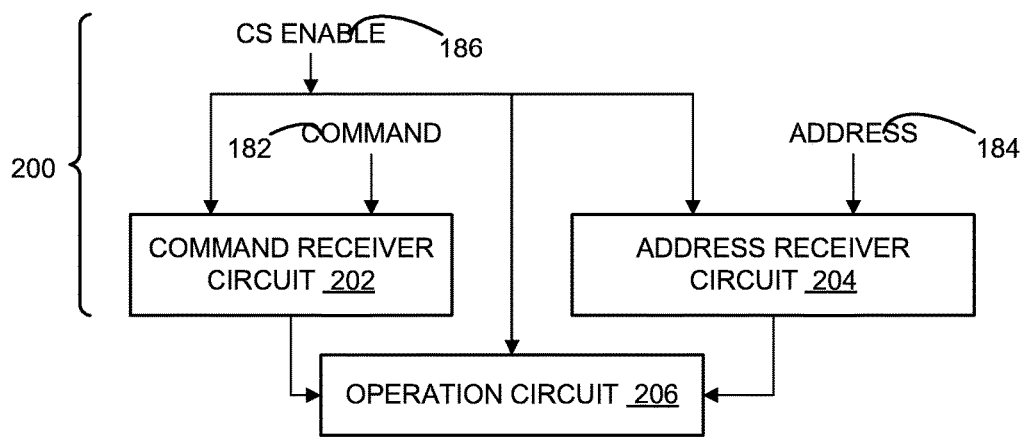
FIG. 2 illustrates a block diagram of an example input management circuit in accordance with an embodiment of the present technology.

FIG. 2 illustrates a block diagram of an example input management circuit 200 in accordance with an embodiment of the present technology. The input management circuit 200 can be configured to manage propagation of input signals (e.g., the command signal 182, the address signal 184, etc.) throughout the memory device 100 of FIG. 1, such as to operation circuit 206 (e.g., the command/address input circuit 105, the address decoder 110, the command decoder 115, row/column decoder, memory array, IO circuit 160, etc. of FIG. 1).

For example, the input management circuit 200 can include a command receiver circuit 202, an address receiver circuit 204, etc. The command receiver circuit 202 can be configured to receive and propagate the command signal 182. The address receiver circuit 204 can be configured to receive and propagate the address signal 184. The command receiver circuit 202 and/or the address receiver circuit 204 can communicate the input signals to the operation circuit 206 based on the chip select signal 186. The command receiver circuit 202 and/or the address receiver circuit 204 can send or propagate the input signals when the chip select signal 186 is enabled (e.g., low for low-enabled systems, such as DDR4). Accordingly, the input management circuit 200 can prevent propagation of the input signals when they are not intended for the memory device 100 as represented by the chip select signal 186. As a result, corresponding circuit operations (e.g., latching) and power consumption can be reduced.

In some embodiments, the command receiver circuit 202 can include gates (e.g., NAND or AND gates) configured to control propagation of the signals according to the chip select signal 186. For example, the command receiver circuit 202 can include a set (e.g., four or more) of gates (e.g., NANDs for DDR4) matching a number of pads/lines that communicate the command signal 182. Along with each bit of the command signal 182, the chip select signal 186 can be routed to each of the gates. Accordingly, the gates can retransmit the command signal 182 when the chip select signal 186 is enabled. In some embodiments, the command path can include 12 gates with 2 optional ones that can move.

Similarly, the address receiver circuit 204 can include gates (e.g., NAND or AND gates) configured to control propagation of the signals according to the chip select signal 186. For example, the address receiver circuit 204 include a set (e.g., eight or more) of gates (e.g., NANDs for DDR4) matching a number of pads/lines that communicate the address signal 184. Along with each bit of the address signal 184, the chip select signal 186 can be routed to each of the gates. Accordingly, the gates can retransmit the address signal 184 when the chip select signal 186 is enabled. In some embodiments, the address path can include 16 gates. In some embodiments, the chip select signal path can include 8 gates.

The circuitry for the chip select signal 186 configured to reduce/minimize a travel time to the command receiver circuit 202. The command receiver circuit 202 can be relatively early in the circuitry and near the input pad. In some embodiments, the command receiver circuit 202 can be included in the command/address input circuit 105. In some embodiments, the command receiver circuit 202 can be immediately after the command/address input circuit 105 or between the input pads and the command/address input circuit 105. In some embodiments, the command receiver circuit 202 can be implemented in CmdDecode block (e.g., the command decoder 115) and the chip select signal 186 can be routed accordingly. In some embodiments, the command receiver circuit 202 can be duplicated in the CmdDecode block as a backup for the CmdDecode block, in case the CmdDecode is not fast enough to stop propagation of the signal there. In some embodiments, the chip select signal 186 can be routed in metal3 with relatively short branches.

In some embodiments, the signal path for routing the chip select signal 186 to the command receiver circuit 202 can be shorter and/or lightly loaded relative to the signal path for routing the chip select signal 186 to the address receiver circuit 204. The chip select signal 186 can be routed to the input buffers of the command receiver circuit 202. The signal path for routing to the address receiver circuit 204 can have greater inherent delay than that for the command receiver circuit 202.

Figure 3:
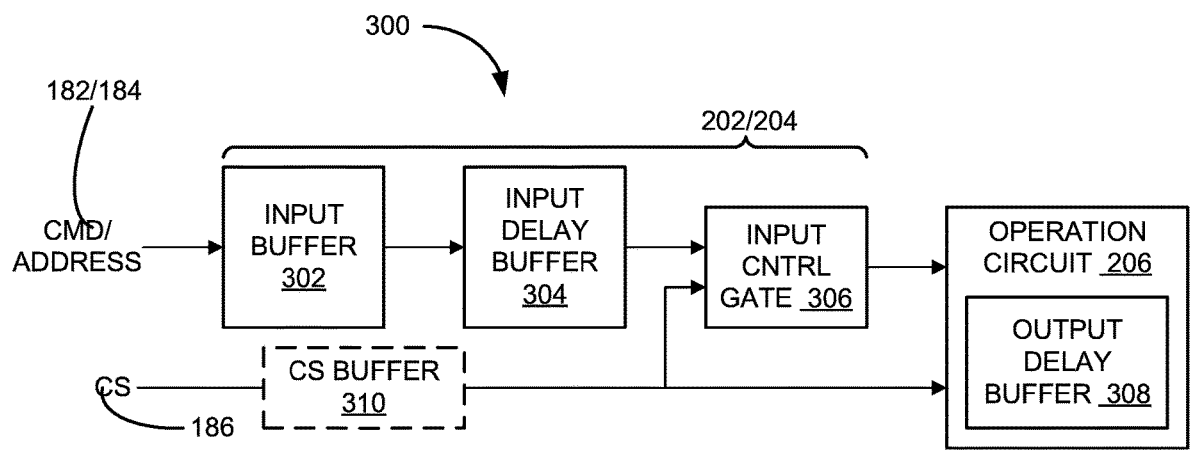
FIG. 3 illustrates a detailed block diagram of an example input management circuit in accordance with an embodiment of the present technology.

FIG. 3 illustrates a detailed block diagram of an example input management circuit 300 in accordance with an embodiment of the present technology. The input management circuit 300 can illustrate details of the input management circuit 200 of FIG. 2. For example, the input management circuit 300 can illustrate one or more embodiments of the command receiver circuit 202 and/or the address receiver circuit 204.

The input management circuit 300 can include an input buffer 302, an input delay buffer 304, an input control gate 306, etc. The input buffer 302 can be configured to receive the input signals. For example, the input buffer 302 can receive the command signal 182, the address signal 184, etc. The input buffer 302 can be electrically coupled to the input delay buffer 304. The input delay buffer 304 can be configured to temporarily hold the signal value and delay the propagation of the input signals. The input delay buffer 304 can delay the input signals to ensure that the input signals arrive at the input control gate 306 no earlier than the chip select signal 186.

The input control gate 306 (e.g., normal gates or more low-voltage threshold (LVT) devices) can be electrically coupled to the input delay buffer 304 and receive the delayed input signal. In some embodiments, the input control gate 306 can receive the input signals directly from the input buffer 302 or a different circuitry component. The input delay buffer 304 can further receive the chip select signal 186. The input management circuit 300 can be configured such that the signal path for the chip select signal 186 is shorter and/or has less components compared to the signal path for the input signals. For example, the signal path for the chip select signal 186 can include three gates with a resistor/capacitor circuit, eight gates, shorter branches, metal3, etc. In comparison, the signal path for the input signals can include 12 gates and/or two optional gates, 15 gates, longer branches, etc.

In some embodiments, the input control gate 306 can include an AND or a NAND gate configured to propagate or send the input signals when the chip select signal 186 is enabled. For example, for DDR4 based systems that employ low-enable signals, the input control gate 306 can include the NAND gate. Accordingly, the input signals (e.g., the command signal 182, the address signal 184, etc.) can be communicated by/from the input control gate 306 to the operation circuit 206 when the chip select signal 186 is a low level corresponding to an enable state. Based on receiving the input signals, the operation circuit 206 can perform the operation corresponding to the command signal 182, such as a read or a write operation). Conversely, the input control gate 306 can stop the propagation of the input signals when the chip select signal 186 is not enabled.

In some embodiments, the input control gate 306 can process the chip select signal 186 and the input signals as they arrive, such as in an asynchronous manner. The input control gate 306 can control propagation of the signals without latching and/or according to a separate synchronization/clock signal. In comparison, the operation circuit 206 can process the signals in a synchronous manner, such as based on latching one or more signals, using a synchronization/clock signal, etc. In some embodiments, the chip select signal 186 can be used to gate the clock (CLK) signal that is used by the capture latch for the command and addresses. The gated CLK can be used to qualify/validate inputs to be executed.

In some embodiments, the input management circuit 300 can include an output delay buffer 308 at or after the input control gate 306. For example, the operation circuit 206 can include the output delay buffer 308 configured to ensure that the chip select signal 186 is sustained at the input control gate 306 and/or the operation circuit 206 for an intended duration and/or past the corresponding portions of the input signals. The output delay buffer 308 can delay the input signals for a duration equivalent to that of the input delay buffer 304. Accordingly, when the input signals are delayed by a certain amount, the chip select signal 186 can be delayed by the same amount such that the operation circuit 206 would see the original timing of the signals relative to each other.

In some embodiments, the input management circuit 300 can include a chip select buffer 310. The chip select buffer 310 can be separate from the input buffer 302 and dedicated to the chip select signal 186. Further, the input management circuit 300 can include a branch in the signal path for the chip select signal 186 to route the signal to the input control gate 306. In some embodiments, the input management circuit 300 can utilize current level greater than 50 µA (e.g., 75/95/133 µA for command/address signals, 180 µA for chip select signal, etc.).

Figure 4:
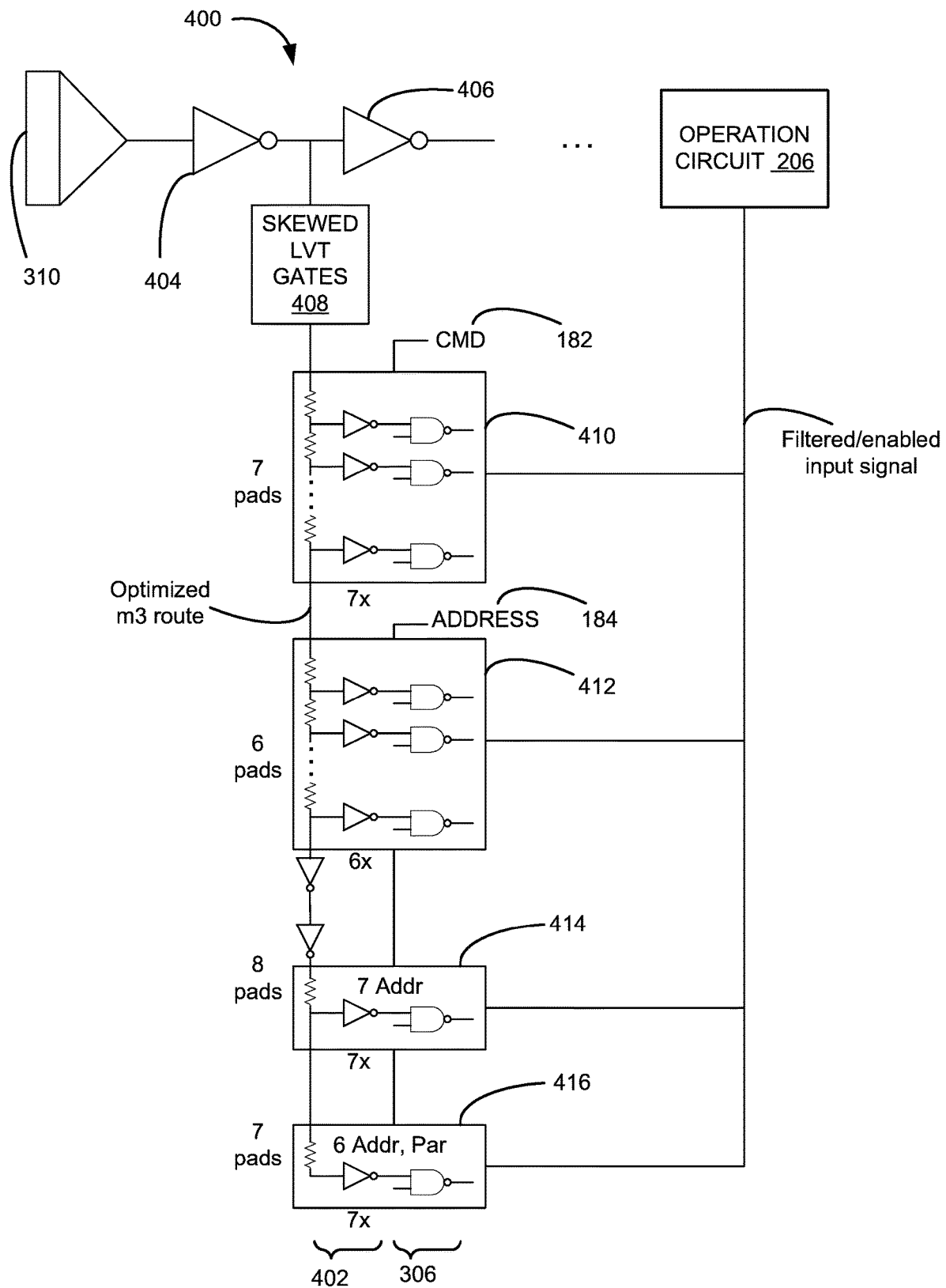
FIG. 4 illustrates a detailed block diagram of an example chip select signal circuit path in accordance with an embodiment of the present technology.

FIG. 4 illustrates a detailed block diagram of an example chip select signal circuit path 400 in accordance with an embodiment of the present technology. The memory device 100 of FIG. 1 can include the circuit path 400 connected to the input pad for the chip select signal 186, the input control gates 306, the operation circuit 206, etc. The circuit path 400 can have one or more portions that are within and/or connected to the command/address input circuit 105 of FIG. 1.

The circuit path 400 can include the chip select buffer 310 connected to a stage-3 circuitry 404 (e.g., inverter/transmitter), output of which is further connected to a stage-4 circuitry 406 (e.g., inverter/transmitter, the output delay buffer 308 of FIG. 3, etc.). The output of the stage-4 circuitry 406 can be communicated to the operation circuit 206.

For controlling the propagation of input signals, the circuit path 400 can include a verification branch 402 configured to route the chip select signal 186 to the command receiver circuit 202 of FIG. 2, the address receiver circuit 204 of FIG. 2, a portion thereof (e.g., the input control gates 306), or a combination thereof. Based on the chip select signal 186 routed through the verification branch 402, the input management circuit 200/300 can control the propagation of the input signals.

The verification branch 402 can tap the chip select signal 186 from the output of the stage-3 circuitry 404. The verification branch 402 can include skewed LVT gates 408 (e.g., logic gates, such as OR, AND, NAND, etc., inverter, or a combination thereof). For example, the skewed LVT gates 408 can include an OR gate feeding a NAND gate, output of which feeds an inverter.

Output of the skewed LVT gates 408 can be provided to a command control circuit 410, a first address control circuit 412, a second address control circuit 414, a third address control circuit 416 (e.g., parity control circuit), etc. Each control circuit can include a set of pads and/or resistive components, inverters/transmitters, the input control gates 306 (e.g., NAND) or a combination thereof. For example, the command control circuit 410 include seven pads and/or resistive components connected in series. The command control circuit 410 can include an inverter/transmitter connected after/between the pads/resistors. The output from each inverter/transmitter can be connected to a NAND gate that further receive a portion of the command signal 182. Accordingly, the output of the NAND gates can be the command signal 182 when the chip select signal 186 is low enabled. Similarly, the first address control circuit 412, the second address control circuit 414, the third address control circuit 416, etc. can include corresponding number of pads/resistors, inverters/transmitters, etc. connected to NAND gates (e.g. input control gates 306) that further receive the address signal 184. Accordingly, the output of the NAND gates for the address/parity control circuits can be the address signal 184 when the chip select signal 186 is low enabled.

The verification branch 402 can further include optimized/processed M3 routes for carrying/communicating the chip select signal 186. The verification branch 402 can also include one or more inverters/transmitters, such as between control circuits. The verification branch 402 can include transmitters/inverters that are configured/formed to have reduced/minimum physical size to reduce delay and power consumption. Similarly, the NAND gates can be configured to have reduced/minimum physical size.

Figure 5:
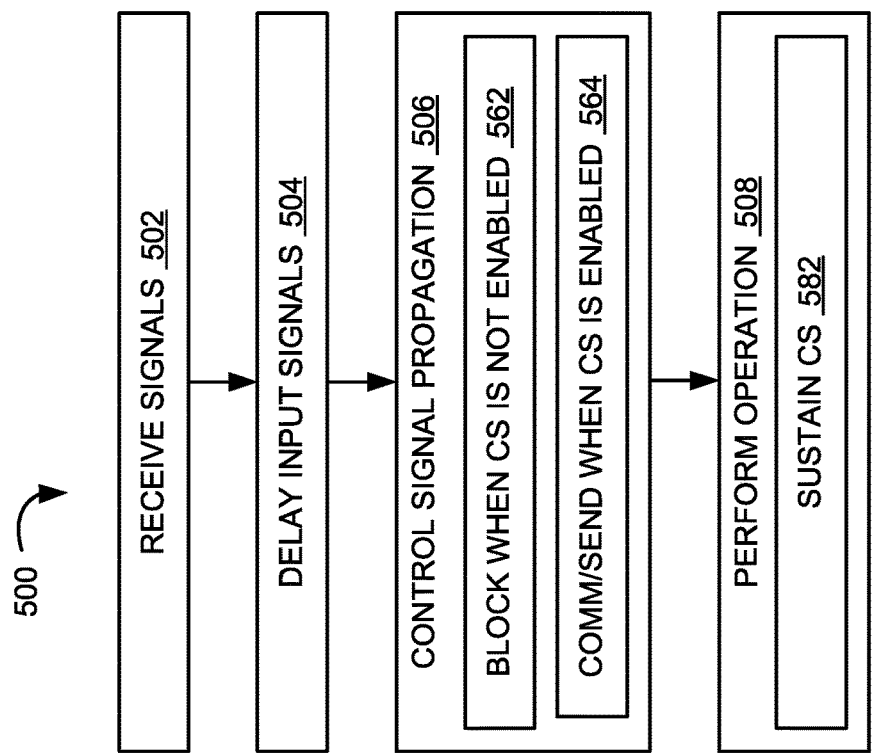
FIG. 5 is a flow diagram illustrating an example method of operating the memory device of FIG. 1 in accordance with an embodiment of the present technology.

FIG. 5 is a flow diagram illustrating an example method 500 of operating the memory device 100 of FIG. 1 in accordance with an embodiment of the present technology. The method 500 can be for operating the input management circuit 200 of FIG. 2, the input management circuit 300 of FIG. 3, the chip select signal circuit path 400 of FIG. 4, etc. The method 500 can be for controlling propagation of the input signals (e.g., the command signal 182 of FIG. 1, the address signal 184 of FIG. 1, etc.), such as to the operation circuit 206 of FIG. 2.

At block 502, the memory device 100 (e.g., input pads/ports, the command/address input circuit 105 of FIG. 1, the input buffer 302 of FIG. 3, the chip select buffer 310 of FIG. 3, etc.) can receive the input signals and the chip select signal 186 of FIG. 1 from an external source (e.g., the memory/system controller). For example, the memory device 100 can receive the command signal 182 and/or the address signal 184 from/controlled by a controller/CPU.

At block 504, the memory device 100 (e.g., the input delay buffer 304 of FIG. 3) can delay the input signals as they go into the input control gate 306 of FIG. 3. For example, the memory device 100 can use delay buffers to delay the command signal 182 and/or the address signal 184, such as to ensure that the chip select signal 186 arrives before or at the same time as the command signal 182 and/or the address signal 184. Since the input control gate 306 controls the propagation asynchronously (e.g., based on arrival of the signals), the input delay buffer 304 can prevent propagation of unintended (e.g., when the chip select signal 186 is not enabled) input signals due to arrival timing issues. The input delay buffer 304 can delay the input signal by a predetermined delay duration.

At block 506, the memory device 100 (e.g., the input control gate 306 of FIG. 3) can control propagation of the input signals according to the chip select signal 186. For example, for low-enable signaling scheme (e.g., DDR4 interfacing schemes), the memory device 100 can include NAND gates (e.g., the input control gate 306) each configured to receive one of the input signals or a portion thereof and the chip select signal 186. Accordingly, when the chip select signal 186 is enabled (e.g., low for DDR4), such as at block 564, the NAND gate can output the received input signal or the portion thereof and communicate it to the operation circuit 206. Otherwise, when the chip select signal 186 is not enabled, such as at block 562, the NAND gate can block propagation of the input signals.

At block 508, the memory device 100 (e.g., the operation circuit 206) can perform the operation (e.g., read or write) corresponding to the input signals. The memory device 100 can implement the read/write operation when the chip select signal is enabled. For example, the operation circuit 206 can receive the input signals when the chip select signal 186 is enabled. Also, the operation circuit 206 can include logic/circuitry that requires the chip select signal 186 to be enabled for performing (e.g., latching, synchronizing, storing charges, reading stored charge amount, etc.) the operation.

In some embodiments, the memory device 100 (e.g., the output delay buffer 308 of FIG. 3) can sustain the chip select signal 186 while the operation is implemented, such as represented at block 582. For example, the output delay buffer 308 can maintain the chip select signal 186 for the same predetermined delay duration as the delay implemented in the input delay buffer 304. As such, the output delay buffer 308 can remain enabled for the same duration as the input signals were delayed. Using the output delay buffer 308, the memory device 100 can maintain the relative timing between the input signals and the chip select signal 186, and ensure that the chip select signal 186 remains active long enough to perform/complete the commanded operation.

Using the above described method 500 to control propagation of the input signals provides reduction in power consumption. The input control gate 306, the input delay buffer 304, the output delay buffer 308, optimized m3 routes, skewed LVT gates, minimum/reduced size gates, etc. can block the input signals from propagating to the operation circuit 206 and being unnecessarily processed (e.g., latched) when the chip select signal 186 is not enabled. Further, the verification branch 402 (e.g., optimized m3 routes, skewed LVT gates, minimum/reduced size gates, path length, etc.) and/or the input delay buffer 304 can be configured to ensure that the chip select signal 186 arrives at the input control gate 306 before the input signals. Thus, the propagation of the input signals can be controlled using asynchronous inputs, and without using additional latching/aligning circuitry.

Figure 6:
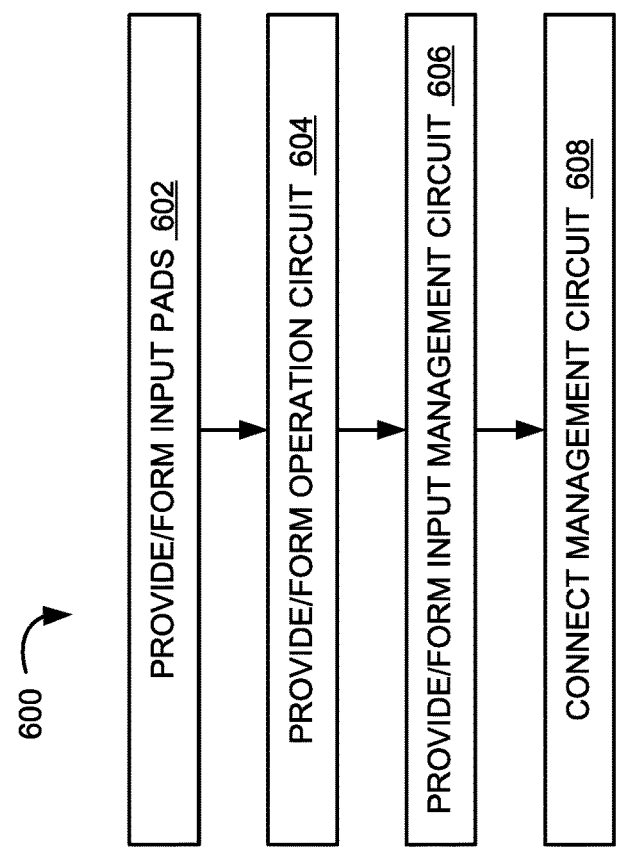
FIG. 6 is a flow diagram illustrating an example method of manufacturing the memory device of FIG. 1 in accordance with an embodiment of the present technology.

FIG. 6 is a flow diagram illustrating an example method 600 of manufacturing the memory device 100 of FIG. 1 in accordance with an embodiment of the present technology. The method 600 can be for manufacturing the input management circuit 200 of FIG. 2, the input management circuit 300 of FIG. 3, the chip select signal circuit path 400 of FIG. 4, etc.

At block 602, input pads/ports can be provided. The provided input pads (e.g., die pads or connector pins) can correspond to the input signals (e.g., the command signal 182 of FIG. 1, the address signal 184 of FIG. 1, etc.) and the chip select signal 186. In some embodiments, providing the input pads can include attaching the pads/ports to a substrate/frame/body portion of the memory device 100. In some embodiments, providing the input pads can include forming, such as using semiconductor or wafer level processes, the input pads on the substrate/frame/body portion of the memory device 100.

At block 604, the operation circuit 206 of FIG. 2 can be provided. The provided operation circuit 206 (e.g., semiconductor devices, active components, passive components, etc.) can be configured to perform memory operations, such as read, write, erase, etc. In some embodiments, providing the operation circuit 206 can include attaching/configuring the circuit components to each other and/or to the substrate/frame/body portion of the memory device 100. In some embodiments, providing the operation circuit 206 can include forming, such as using semiconductor or wafer level processes, the circuit components and the connections on the substrate/frame/body portion.

At block 606, the command receiver circuit 202 of FIG. 2 and/or the address receiver circuit 204 of FIG. 2 can be provided. For example, the input buffer 302, the input delay buffer 304, the input control gate 306, the output delay buffer 308, the chip select buffer 310, etc., all of FIG. 3, can be provided. As discussed above, providing the receiver circuit(s) can include attaching circuit components to the each other and/or to the substrate. In some embodiments, providing the receiver circuit(s) can include semiconductor or wafer level processes that form and connect the circuit components on the substrate.

At block 608, the various circuits can be electrically connected to create/complete one or more signal paths. For example, the receiver circuit(s) (e.g., the command receiver circuit 202 and/or the address receiver circuit 204) and/or the output delay buffer 308 can be connected to the input pads and the operation circuit 206. Accordingly, the chip select signal circuit path 400 of FIG. 4 and/or the input signal circuit path can be completed from the input pads to/through the operation circuit 206. In some embodiments, connecting the circuits can include attaching or forming conductive components (e.g., wires or trace) between the circuits. In some embodiments, the connection process can be included in the circuit formation process.

Figure 7:
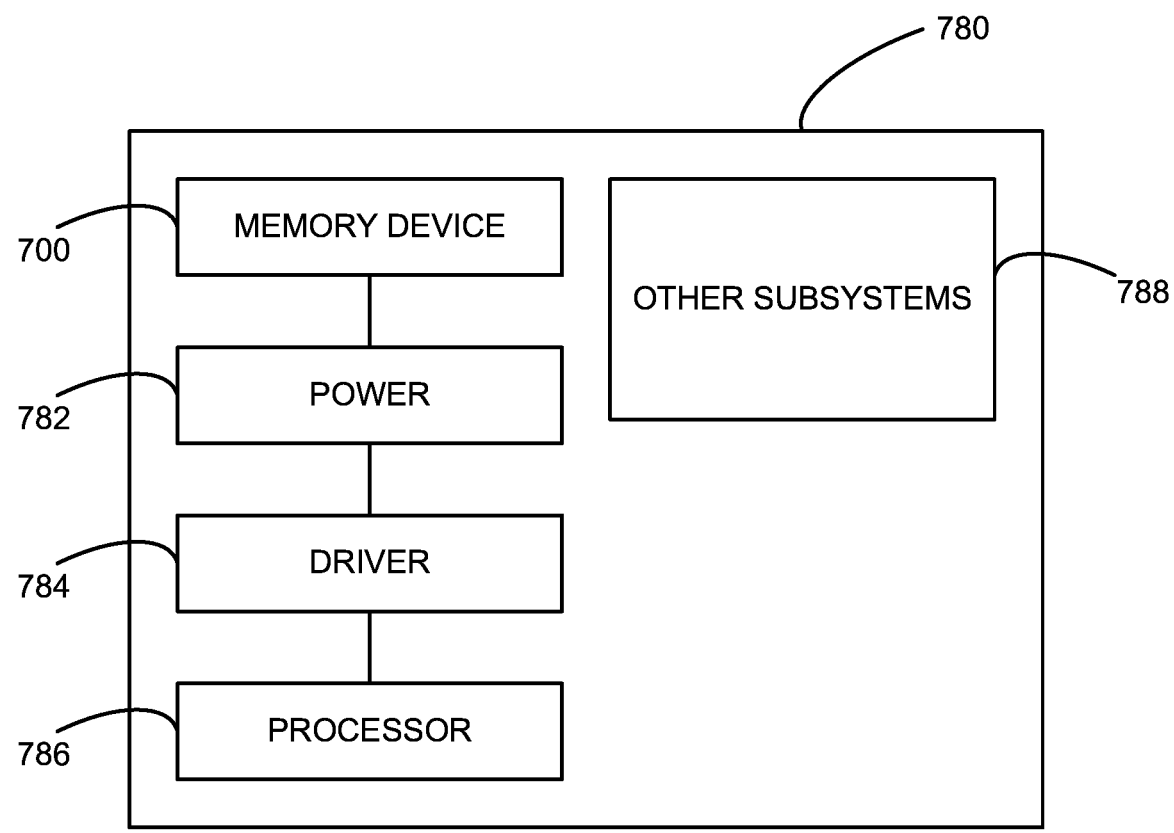
FIG. 7 is a schematic view of a system that includes a memory device in accordance with an embodiment of the present technology.

FIG. 7 is a schematic view of a system that includes a memory device in accordance with embodiments of the present technology. Any one of the foregoing memory devices described above with reference to FIGS. 1-6 can be incorporated into any of a myriad of larger and/or more complex systems, a representative example of which is system 780 shown schematically in FIG. 7. The system 780 can include a memory device 700, a power source 782, a driver 784, a processor 786, and/or other subsystems or components 788. The memory device 700 can include features generally similar to those of the memory device described above with reference to FIGS. 1-6, and can therefore include various features for performing a direct read request from a host device. The resulting system 780 can perform any of a wide variety of functions, such as memory storage, data processing, and/or other suitable functions. Accordingly, representative systems 780 can include, without limitation, hand-held devices (e.g., mobile phones, tablets, digital readers, and digital audio players), computers, vehicles, appliances and other products. Components of the system 780 may be housed in a single unit or distributed over multiple, interconnected units (e.g., through a communications network). The components of the system 780 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the memory devices have been described in the context of DRAM devices. Memory devices configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

For illustrative purposes, the various embodiments have been described with respect to the command pins and the address pins of a DRAM. However, it is understood that the management/power savings can be applied to other inputs, such as data (DQ), data mask (DM), on die termination (ODT), clock enable pin (CKE), etc. Further the management/power savings described above can be applied to other semiconductor devices, including devices outside of the memory/storage applications, with general input information that is also equipped with a CS-like pin used as an enable to the device.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-7.

We claim:

1. A memory device, comprising:
a set of input pads configured to receive from a source external to the memory device one or more input signals and a chip select signal;
an operation circuit electrically coupled to the input pads, the operation circuit configured to receive the one or more input signals via one or more input paths and perform operations corresponding to the one or more input signals when the chip select signal is enabled; and
an input management circuit electrically coupled to and between the input pads and the operation circuit, the input management circuit configured to select based on the chip select signal (1) propagating the one or more input signals to the operation circuit or (2) preventing propagation of the one or more input signals over the one or more input paths.

2. The memory device of claim 1, wherein the input management circuit includes an input control gate configured to:
receive the chip select signal and the one or more input signals;
block propagation of the one or more input signals when the chip select signal is not enabled; and
communicate the one or more input signals to the operation circuit when the chip select signal is enabled.

3. The memory device of claim 2, wherein the input management circuit includes an input delay buffer electrically coupled to the input control gate, the input delay buffer configured to delay arrival of the one or more input signals at the input control gate.

4. The memory device of claim 3, further comprising an output delay buffer electrically coupled to the input control gate, the output delay buffer configured to sustain the chip select signal at the operation circuit.

5. The memory device of claim 4, wherein:
the input delay buffer is configured to delay the one or more input signals by a delay duration; and
the output delay buffer is configured to sustain the chip select signal for the delay duration.

6. The memory device of claim 2, further comprising:
a first circuit path electrically coupled to a portion of the input pads and the input control gate, the first circuit path configured to communicate the chip select signal to the input control gate; and a set of second circuit paths electrically coupled to a portion of the input pads and the input control gate, the set of second circuit paths configured to communicate the one or more input signals to the input control gate, wherein:

the first circuit path has a shorter path distance, less circuitry components, or a combination thereof in comparison to the set of second circuit paths.

7. The memory device of claim 2, wherein the input control gate is an AND gate or a NAND gate.

8. The memory device of claim 1, wherein the input management circuit is configured to control propagation of the one or more input signals asynchronously and based on arrival of the one or more input signals, the chip select signal, or both at the input management circuit.

9. The memory device of claim 1, wherein the one or more input signals include a command signal, an address signal, or both.

10. The memory device of claim 1, wherein the input management circuit is physically located on the memory device closer to the input than the operation circuit.

11. The memory device of claim 1, wherein the input management circuit includes a chip select buffer dedicated to the chip select signal configured to receive the chip select signal.

12. The memory device of claim 1, wherein the input management circuit includes one or more low-voltage threshold (LVT) devices.

13. The memory device of claim 1, wherein the memory device comprises a dynamic random-access memory (DRAM) device.

14. The memory device of claim 13, wherein the memory device is a Double Data Rate (DDR) device.

15. A method of operating a memory device, the method comprising:

receiving from a source external to the memory device one or more input signals and a chip select signal;

controlling propagation of the one or more input signals based on the chip select signal, wherein controlling the propagation includes selecting based on the chip select signal (1) propagating the one or more input signals to an operation circuit or (2) preventing propagation of the one or more input signals over the one or more input paths; and performing operations corresponding to the one or more input signals when the chip select signal is enabled.

16. The method of claim 15, wherein controlling propagation of the one or more input signals includes:

blocking propagation of the one or more input signals when the chip select signal is not enabled; and communicating the one or more input signals to an operation circuit when the chip select signal is enabled, the operation circuit configured to perform the operations corresponding to the one or more input signals.

17. The method of claim 15, further comprising delaying the one or more input signals before controlling propagation of the one or more input signals.

18. The method of claim 17, further comprising sustaining the chip select signal during operations corresponding to the one or more input signals.

19. The method of claim 18, wherein:

delaying the one or more input signals includes delaying the one or more input signals by a delay duration; and sustaining the chip select signal includes sustaining the chip select signal for the delay duration.

20. A method of manufacturing a memory device, the method comprising:

providing a set of input pads configured to receive from a source external to the memory device one or more input signals and a chip select signal;

providing an operation circuit configured to perform operations corresponding to the one or more input signals when the chip select signal is enabled; and electrically connecting an input management circuit between the input pads and the operation circuit, the input management circuit configured to select based on the chip select signal (1) propagating the one or more input signals to the operation circuit or (2) preventing propagation of the one or more input signals over the one or more input paths.

* * * * *